July 7, 1970 L. E. NORTON 3,518,749

METHOD OF MAKING GUNN-EFFECT DEVICES

Filed Feb. 23, 1968

INVENTOR
LOWELL E. NORTON
BY
W. S. Hill
AGENT

United States Patent Office 3,518,749
Patented July 7, 1970

3,518,749

METHOD OF MAKING GUNN-EFFECT DEVICES

Lowell E. Norton, Princeton, N.J., assignor to RCA Corporation, a corporation of Delaware Filed Feb. 23, 1968, Ser. No. 707,668
Int. Cl. H01l 7/24
U.S. Cl. 29—571 1 Claim

ABSTRACT OF THE DISCLOSURE

A Gunn-effect diode oscillator comprising a substrate layer of high resistivity semiconductor material, an epitaxial surface layer of a semiconductor such as gallium arsenide, and two closely-spaced elctrodes on the surface layer, wherein the electrodes occupy less than the entire width of the epitaxial layer in order to utilize only that part of the layer having an undamaged crystalline structure.

BACKGROUND OF THE INVENTION

The present invention relates to improved electrode structures for Gunn-effect semiconductor diodes and to an improved method of fabricating the electrode structure.

Gunn-effect devices comprise a uniform single crystal body of bulk semiconductor material with two spaced electrodes. Either a steady state or a pulsed D.C. voltage is applied across the body and when a characteristic threshold voltage is reached or exceeded, current oscillations are produced. The oscillation frequency depends mainly on the transit time of electrons travelling across the gap between the electrodes.

It has been shown that the current oscillations are produced by a region of high electric field building up near the cathode and propagating with constant velocity toward the anode where it disappears, followed by a new high field domain building up at the cathode, all in a periodic manner.

The phenomenon occurs in semiconductors having a high mobility state that is lowest in energy along with low mobility states at a higher energy level. As the applied electric field is increased, some electrons are transferred from the high mobility state to the low mobility states resulting in an average electron velocity decrease.

By incorporating this device, operating at room temperature, into a radio frequency circuit, microwave power can be delivered to a load.

Previously, Gunn-type devices have been made with the semiconductor body in the shape of a small die, and ohmic contacts made to opposite faces of the crystal body. In order to conduct heat away from the body rapidly, metal studs were soldered to one or both ohmic contacts. However, since the amount of heat generated in the device may be relatively large (a power density of the order of a megawatt per cubic centimeter, for example) the relatively long heat path in this type of construction has proved to be unfavorable.

A better heat conducting structure has been provided by growing the semiconductor body as an epitaxial layer on a high-resistivity semiconductor crystal substrate and placing the ohmic contacts in a coplanar manner on the same surface of the layer. This construction provides a better structure for heat transfer through the thin epitaxial layer to the two high thermal conductivity heat dissipators which also serve as ohmic contacts.

However, it has also been found that the coplanar type structure introduces some disadvantages. Electrical characteristics of the device are highly sensitive to surface defects of the crystal and to surface damage that may occur during processing. In order to fabricate the devices in an economical manner, many of them are made simultaneously on a single wafer of semiconductor material. The wafer must subsequently be diced into individual device units. This needs to be done in such a way that damage to the electrode gap is minimized.

OBJECTS OF THE INVENTION

An object of the present invention is to provide an improved method of fabricating Gunn-effect coplanar-type devices in which damage to the gap is substantially avoided.

Another object of the invention is to provide an improved structure for coplanar-type Gunn-effect devices in which only undamaged semiconductor crystal is utilized.

SUMMARY OF THE INVENTION

One aspect of the present invention is an improved method of fabricating many Gunn-effect devices from a wafer of semiconductor material, comprising growing a thin epitaxial layer of desired resistivity semiconductor material on a crystalline substrate of high resistivity semiconductor material, depositing on the surface of the semiconductor layer a pattern of discrete ohmic contacts, leaving spaces in one direction between the contacts for electron transit gaps in the completed devices, and leaving other spaces between the contacts in a direction transverse to the one direction. The wafer is then divided into individual devices by making one set of cuts through the ohmic contacts parallel to the gaps but remote from the gaps, and another set of cuts through the other spaces and transverse to the first set of cuts.

Another aspect of the invention is an improved device which comprises:

(a) A substrate layer of high resistivity semiconductor material, (b) An epitaxial surface layer of particular width on the substrate, of a semiconductor material of the type having a high mobility state which is low in energy and a low mobility state which is high in energy, and which is capable of transferring electrons from the high mobility state to the low mobility state, under the influence of an electric field, (c) A pair of ohmic electrodes on a surface of the epitaxial layer, spaced by a gap of predetermined width, these electrodes occupying less than the entire width of the epitaxial layer, and, preferably (d) A layer of low-loss insulating material on said epitaxial layer within the gap.

THE DRAWING

The following is an example of manufacturing a device in accordance with the present invention using a preferred form of the method of the invention.

PREFERRED EMBODIMENT

Figure 1:
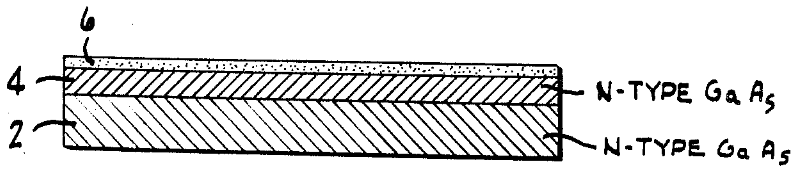
FIG. 1 is a cross-section view including a semiconductor wafer in an intermediate stage of processing in the manufacture of a device in accordance with the present invention.

As shown in FIG. 1, in making devices in accordance with the method of the present invention, one may start with a substrate 2 of gallium arsenide of N type conductivity and having a very high resistivity of the order of, say, $10^8$ ohm centimeters. On the substrate is grown an epitaxial layer 4 of N type gallium arsenide having an appropriately high resistivity of 0.5 ohm-cm. and a thickness of 25 microns. The gallium arsenide layer 4 has a resistivity small enough so that the critical *nl* product is exceeded. Here *n* is the per unit volume carrier concentration, and *l* is the transit gap length. On top of the epitaxial layer 4 is a layer 6 of silicon dioxide which is about 1 micron thick.

Using photoresist, Shipley for convenience, a pattern of openings 8 is made in the silicon dioxide layer 6. As illustrated, the openings are in a pattern of rows and columns and are rectangular in shape. Between each column of openings a column 10 of silicon dioxide is left on the epitaxial layer 4, and in a transverse direction between each of the openings 8 there is left a thin ridge 12 of silicon dioxide. The ridges 12 of silicon dioxide have a width of about $10^{-2}$ centimeters for 1 kmHz. devices. The wider columns 10 of silicon dioxide may have a width of about $7.6 \times 10^{-2}$ centimeters.

Within the openings 8, ohmic contacts 14 are now fabricated as follows: a silver-germanium-indium alloy having the composition 90% silver, 5% germanium, and 5% indium, all by weight, is evaporated over the entire surface, including the remaining silicon dioxide and the openings 8. The metal is then alloyed into the openings 8 to complete the ohmic contacts 14. The temperature of alloying carbonizes the remaining photoresist which has been left in place over the silicon dioxide pattern which causes the metal alloy to fall off in those areas protected by the oxide. Any of the alloy remaining on the silicon dioxide is removed by a photoresist/etch process as follows: A second coating of photoresist (preferably Eastman KPR) is first applied. The photoresist is then removed in the regions of unwanted ohmic contact metal covering the silicon dioxide layer. Next, the unwanted metal alloy is etched off the silicon dioxide layer. In the second photomasking process above described, it is preferable to use a photomask which has gaps having a width of only about ¾ that of the $10^{-2}$ cm. wide silicon dioxide ridges to prevent undercutting during the etching treatment.

Figure 4:
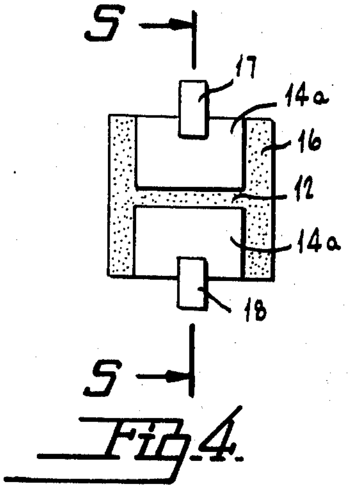
FIG. 4 is a plan view of a single unit device of the present invention.
Figure 2:
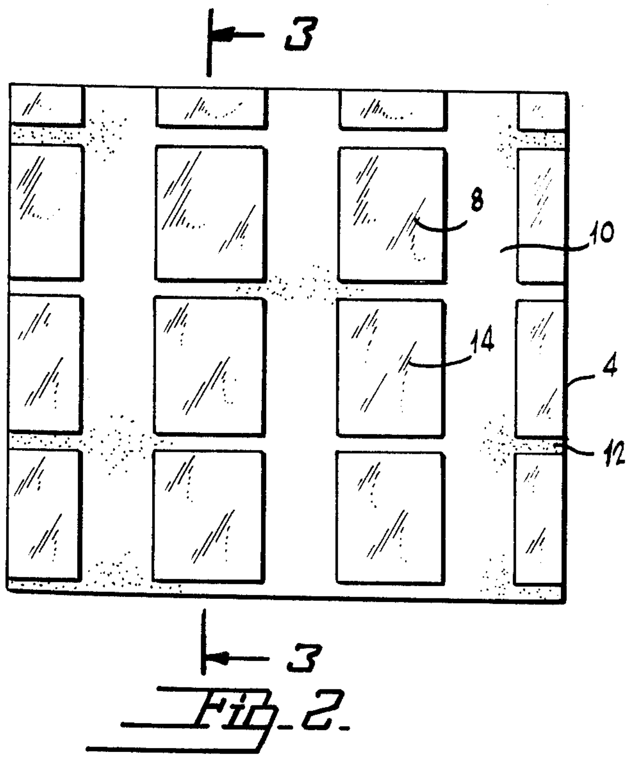
FIG. 2 is a plan view of the wafer of FIG. 1 at a later stage of processing.
Figure 5:
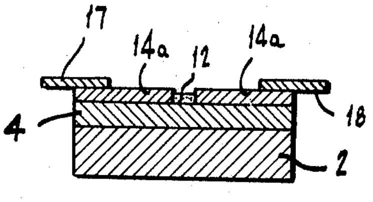
FIG. 5 is a cross-section view taken along the line 5—5 of FIG. 4.
Figure 3:
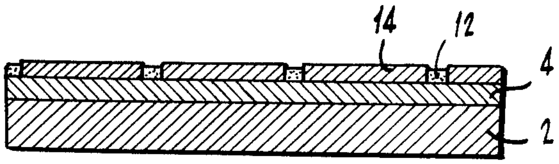
FIG. 3 is a cross-section view taken along the line 3—3 of FIG. 2.

Two sets of saw cuts are now made to separate the wafer into individual devices. Cutting may be done with a $2.54 \times 10^{-2}$ cm. saw. One set of saw cuts is made across the midpoints of the ohmic contacts 14, halfway between the ridges 12. The other set of saw cuts is made transverse to the first set and down the centers of the $7.62 \times 10^{-2}$ centimeter wide columns 10 of silicon dioxide. This effectively separates the wafer into individual devices 16 as shown in FIGS. 4 and 5. Each device may then have silver wires 17 and 18 soldered to the ohmic contacts **14*a*. It should be noted that the Gunn transit gaps between the ohmic electrodes 14*a*** are protected with silicon dioxide at all times during the processing treatment. This helps to protect the sensitive gaps from surface damage. Further protection is given by making one set of saw cuts through the ohmic contacts far enough away from the gaps to prevent surface damage from the sawing operation, and making the other set of saw cuts through the separation gaps far enough away from the active portion of the gaps so that damage is also eliminated from this source.

Considerable improvement in device operation has been obtained by leaving electrical insulation in the transit gaps 12 between the ohmic electrodes since surface burnout has been greatly reduced.

Good ohmic contacts have also been made by using an alloy composed of 88 parts by weight gold, 12 parts by weight germanium and 0.6 part by weight nickel.

What is claimed is:

1. A method of manufacturing Gunn-effect semiconductor device comprising:
   (a) growing on a surface of a single crystalline substrate wafer of high resistivity semiconductor material a thin epitaxial layer of a semiconductor material of the type having a high mobility state which is low in energy and a low mobility state which is high in energy and which is capable of transferring electrons from said high mobility state to said low mobility state under the influence of an electric field,
   (b) providing a layer of electrical insulating material on said epitaxial layer,
   (c) forming a plurality of openings in said insulating layer with said openings being in a pattern of rows and columns leaving spaces in one direction between the rows of the openings and spaces in a direction which is transverse to said one direction between the column of openings,
   (d) depositing a contact metal over the insulating layer and on the surface of the epitaxial layer within each of the openings in the insulating layer,
   (e) removing the contact metal from over the insulating layer to provide a separate contact on the surface of the epitaxial layer within each of the openings in the insulating layer and
   (f) dividing said wafer into individual devices by making one set of cuts through said ohmic contacts parallel to the spaces between the rows of openings, and another set of cuts through said other spaces between said ohmic contacts and transverse to said one set of cuts.

References Cited

UNITED STATES PATENTS

| | | | |
|---|---|---|---|
| 3,212,162 | 10/1965 | Moore | 317—234 |
| 3,431,472 | 4/1969 | Castrucci et al. | 317—234 |
| 3,435,303 | 3/1969 | Braslau | 317—234 |
| 3,443,169 | 5/1969 | Foxell et al. | 331—107 |

OTHER REFERENCES

Solid State Electronics, "Ohmic Contacts for Ga AS Devices" by Cox et al., pp. 1213–14, December 1967.

PAUL M. COHEN, Primary Examiner

U.S. Cl. X.R.

29—590